United States Patent [19]
Litt et al.

[11] Patent Number: 5,707,575
[45] Date of Patent: Jan. 13, 1998

[54] METHOD FOR FILLING VIAS IN CERAMIC SUBSTRATES WITH COMPOSITE METALLIC PASTE

[75] Inventors: David K. Litt; Jorge M. Hernandez, both of Mesa, Ariz.

[73] Assignee: Micro Substrates Corporation, Tempe, Ariz.

[21] Appl. No.: 282,055

[22] Filed: Jul. 28, 1994

[51] Int. Cl.⁶ .................................................. C04B 35/00
[52] U.S. Cl. ................................... 264/104; 264/259
[58] Field of Search .......................... 264/104, 259

[56] References Cited

U.S. PATENT DOCUMENTS 3,948,706  4/1976  Schmeckenbecher .................. 156/89
5,490,965  2/1996  Christiansen .......................... 264/237

*Primary Examiner*—Christopher A. Fiorilla
*Attorney, Agent, or Firm*—Fishman, Dionne, Cantor & Colburn

[57] ABSTRACT

A method and apparati for improved filling of via holes wherein compressive force is used to columnate conductive material due to a pseudoplastic thixotropic rheology of the material. Columnating of the material provides for easier and more accurate filling of via holes. Both automated roller apparati and manual methods are provided. The method further includes methods and apparati of removing excess conductive material from substrates after filling the via holes.

2 Claims, 7 Drawing Sheets

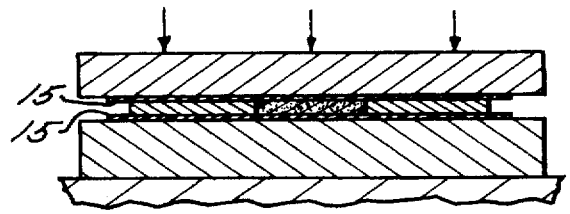
FIG. 4A   FIG. 4B
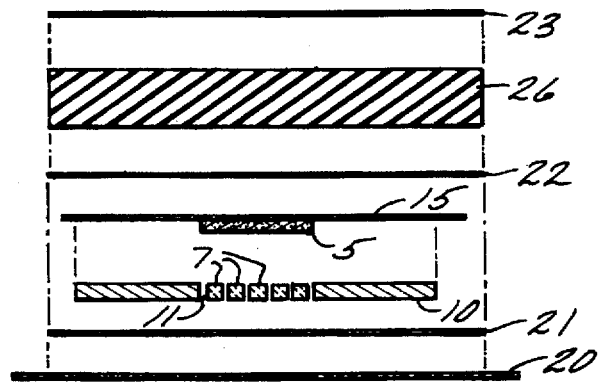
FIG. 5
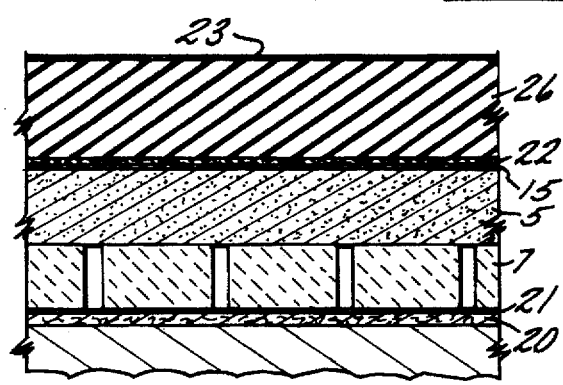
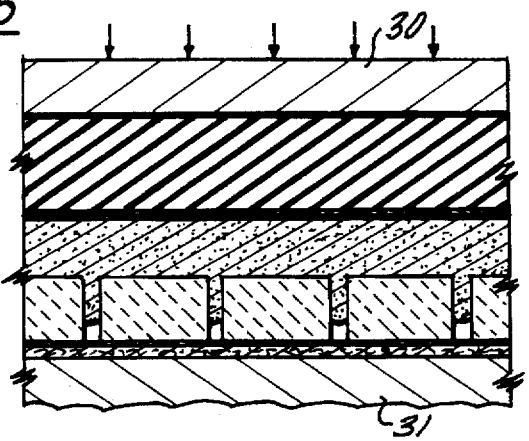
FIG. 6A   FIG. 6B
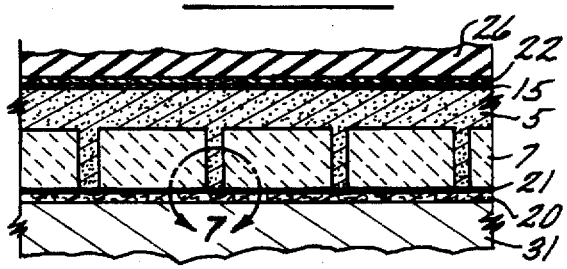
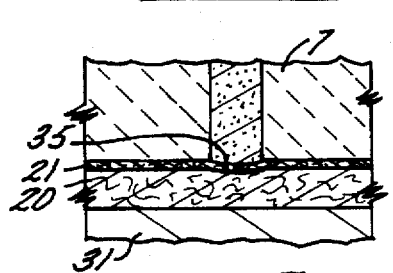
FIG. 6C   FIG. 7

METHOD FOR FILLING VIAS IN CERAMIC SUBSTRATES WITH COMPOSITE METALLIC PASTE

BACKGROUND OF THE INVENTION

1. Field of the Invention

This invention relates to the field of electronic boards using ceramic substrates having metallic composite paste filled vias.

2. Prior Art

As time continues to progress the global trend toward miniaturization of electronic devices poses many engineering difficulties which must be overcome. One such difficulty occasioned by the miniaturization trend is that circuit boards must be smaller thus necessitating smaller vias in the circuit boards. Quality control is difficult and it is important that such quality is high.

Vias are holes running from one surface of a substrate material to the other surface thereof. Generally vias are filled with an electrically conductive material.

It is very important consequent to the development of extremely sensitive electronic equipment that vias are filled with a very high degree of accuracy. Each via must be properly filled; this requires that the fill material is a coherent column of material within the via hole and that the column either be flush with both surfaces of the substrate or protrude slightly from one or both ends of the via hole, in a dome shape.

Methods used to fill via holes are judged based upon the degree of coherency of the fill and the degree to which unfilled or partially filled via holes are present after the filling process, as well as the simplicity of the method. Prior art methods include, inter alia, stencil and squeegee methods and syringe methods.

U.S. Pat. No. 4,942,076 is an example of a prior art via filling method. This patent is commonly assigned to the assignee hereof, Micro Substrates, Inc. and is incorporated herein by reference. The Patent discloses a ceramic substrate with metal filled via holes for hybrid microcircuits and a method of making the same. Taught is an as-fired alumina substrate of about 0.030 inches in thickness, with vias of about 0.013 inches in diameter drilled therein. The drilled vias are of a high degree of dimensional and positional accuracy due to employment of a laser to enhance accuracy. Subsequent to drilling vias, a metallic paste having a high concentration of Tungsten in an organic binder is placed in the vias. The solids content by volume is between 80% and 85%. The patent teaches the filling of the vias with the tungsten paste by pressing or squeezing the paste through the holes in a stencil into the via holes.

The stencil itself is constructed of, usually, stainless steel having a thickness of about 0.002 inches and includes holes in a pattern identical to the via holes in the substrate.

This prior art method works sufficiently well when the aspect ratio of the vias to the substrate is within moderate limits. The sizes disclosed in the patent yield an aspect ratio of 2.3 which is sufficiently low for the method to be effective. However, as the aspect ratio grows by either a) using smaller diameter vias or b) using thicker substrate material, the probability of partially filled vias or completely unfilled vias increases dramatically. Moreover, stencil wear and squeegee wear contribute notably to less than adequate filling of via holes.

Regardless of the reason for the inadequate filling of via holes, the result is the necessity of manual touch-up and reworking. As is known to one of skill in the subject art, touch-up and reworking are time consuming and expensive processes resulting in decreased efficiency of production.

A number of methods are utilized to manually fill via holes that were not filled in the production process including manual placement of the metallic material by an air powered syringe under a microscope and placing a quantity of paste over the defective via and then squeezing the paste into the hole. These methods have some effectiveness but suffer from air trapped within the partially filled via. It is very difficult to provide a coherent column of paste within the via because trapped air prevents flow of the paste. Poorly filled vias then are responsible for poor electrical connections.

SUMMARY OF THE INVENTION

The above-discussed and other drawbacks and deficiencies of the prior art are overcome or alleviated by the method for filling via holes presented herein.

A method is disclosed which concerns the reliable filling of vias in drilled ceramic substrate materials. A pattie of metallic paste is formed with release material disposed on either side of the pattie. Once the pattie is formed, one layer of release material is removed and the pattie is incorporated in a lay-up of materials. The lay-up, i.e. stack of materials, comprises a first layer of soft tissue paper; a second layer of a porous, absorbant material like newsprint paper or other similar material; a third layer comprising the substrate to be filled; a fourth layer comprising the pattie of metallic paste with a release layer thereabove; this layer is followed by another layer of newsprint (layer fifth); a sixth layer of preferably silicone or neoprene rubber followed by a seventh layer of newsprint. These seven layers are compressed with sufficient compressive force to squeeze the metallic paste into the vias to fill the same.

With the seventh, sixth and fifth layers removed and the release layer removed from the metallic paste, a blade is utilized to remove excess metallic paste from the substrate material. A vibratory, oscillatory movement of the blade while being drawn across the surface of the substrate is effective.

It is axiomatic that the above description of the method of the invention can be carried out essentially manually for low volume production or can be mechanized for higher volume production. Generally, for mechanized production, fixed gap rollers are utilized to form fixed thickness tape of the metallic paste. The tape is then mechanically cut and applied to the substrate material.

The above-discussed and other features and advantages of the present invention will be appreciated and understood by those skilled in the art from the following detailed description and drawings.

BRIEF DESCRIPTION OF THE DRAWINGS

Referring now to the drawings wherein like elements are numbered alike in the several FIGURES:

FIG. 4A is a cross section of the illustration of FIG. 3;

FIG. 4B is a cross sectional view of a pattie being formed in an apparatus of the invention;

FIG. 5 is an exploded view of all of the layers associated with the method of filling via holes of the invention;

FIG. 6A is a cross section view of the assembled layup;

FIG. 6B is a sequential view from FIG. 6A showing the paste filling the vias;

FIG. 6C is a further sequential view from FIG. 6B illustrating completely filled vias;

FIG. 7 is an enlarged view of the circumscribed section of FIG. 6C illustrating the slight deflection of newsprint layer due to via filling;

DESCRIPTION OF THE PREFERRED EMBODIMENT

Figure 1:
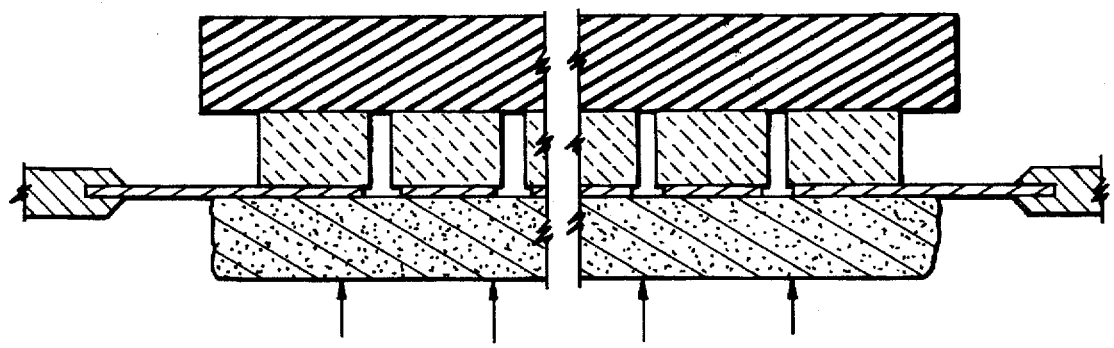
FIG. 1 is a cross section illustration of a prior art method for filling vias using a stencil.
Figure 2A:
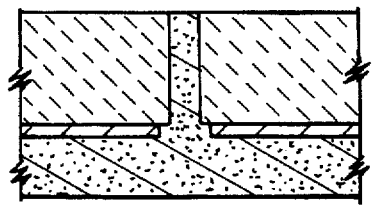
FIG. 2A is a cross section illustration of a filled via, a stencil and bulk paste.
Figure 2B:
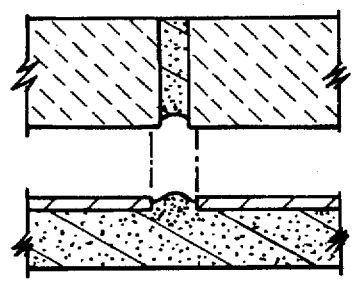
FIG. 2B is a sequential view of 2A taken after removal of the stencil.

FIGS. 1, 2A and 2B illustrate the prior art in via filling; particular attention should be directed to FIG. 2B where the reason the prior art is deficient is exemplified in a less than completely filled via.

A method of filling via holes with a metallic paste is provided wherein the filling has a filling success rate of 99.96–100%. To effect these results a lay-up arrangement is utilized in conjunction with the induced psuedoplastic thixotropic rheology of the metallic paste material under pressure.

The method comprises three broad steps as follows: (1) a pattie of metallic paste is formed; 2) the pattie is placed atop a substrate material bearing via holes in the seven layer lay-up and the lay-up is compressed; 3) the lay-up is disassembled and excess metallic paste is removed from the substrate with a blade to provide high quality filled via holes.

Figure 3:
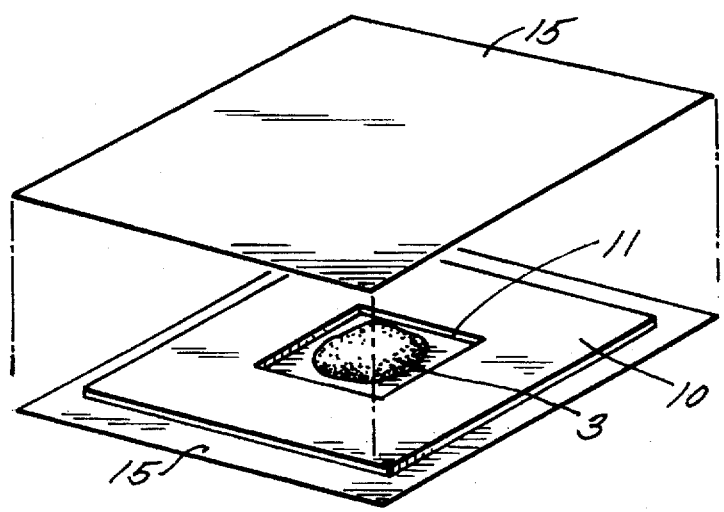
FIG. 3 is a perspective view of the method and apparatus of producing a pattie.
Figure 8:
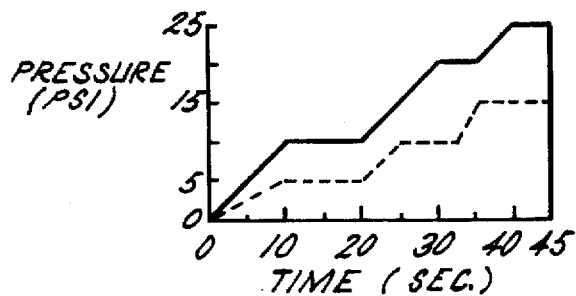
FIG. 8 is a graphic representation of the pressure required to fill the via holes.

Referring to FIG. 3 and 4A, in order to form a pattie of the invention, a quantity of bulk metallic paste 3, previously produced, is formed into the pattie 5 manually, for low volume applications, or in an automated roller system for high volume operations. For low volume operations a form 10 is used to provide boundaries for the formed pattie 5. Since the metallic paste is formed of metal material in an organic binder medium the paste is sticky and therefore requires the use of release films 15 when forming pattie 5. Release films 15 are films which are not subject to the sticky nature of the paste, i.e. they don't get stuck to the paste and can be easily removed. Moreover, the films function to prevent the organic binder, solvents, surfactants and other volatile components of the paste from evaporating, which would otherwise alter the flow characteristics of the paste. Preferred films include polyolefin, polypropylene, acetate or wax paper. Thicknesses of 0.002 inches are most preferred for these materials. It has also been found that teflon film is effective. The most preferred thickness of teflon film is 0.001 inches. In order to avoid the pattie sticking to the form 10, the form is coated with a non-stick coating, preferably teflon. The most preferred embodiment of from 10 is an anodized aluminum structure coated with teflon. The form 10 is of any desired shape although most preferably includes a square or rectangular cut out 11 in the form 10 to accept the metallic paste. Release films are placed above and below form 10 and the paste therein is compressed into a pattie. Pattie 5 is optimally 20–30% thicker than the substrate material 7 onto which it will subsequently be applied, however, percentages of as low as 15% and as high as 50% are acceptable. Pattie 5 should have perimetrical dimensions substantially similar to that of the substrate to be utilized. Volume of bulk paste required is easily quantifiable based upon desired pattie dimensions and the density of the metallic paste.

Following the settings of the parameters, the release films 15, form 10 and paste 3 are subject to compressive force on the order of from 80 to 120 psi for a period of at least 45 sec or until the pattie 5 is visibly formed. Speed of pattie formation can be varied by varying the amount of pressure exerted on the set up. Generally more pressure will yield a pattie more quickly than lesser pressure.

Once the pattie 5 is formed, one of the release layers is removed exposing one surface of form 10 and one surface of the pattie. Referring to FIGS. 4B and 5, form 10 is removed and placed atop a layer of newsprint paper 21, which is atop a layer of tissue paper 20. Pattie 5 which is still lightly adhered to one of the release films 15 is placed atop the substrate 7 which has been placed within the cut-out 11 in form 10. The cut-out 11 in form 10 is preferably sized to allow for easy insertion of substrate 7 therein; thus the cut-out is normally made slightly larger in planar dimension than the substrate 7. Following pattie 5 with release film 15, newsprint 22 is placed upon the release film 15. A deformable resilient layer 26 of preferably rubber material, and most preferably neoprene or silicone rubber is placed over the newsprint 22, followed finally by newsprint 23.

Tissue paper 20 and deformable resilient layer 26 function together in the lay-up to absorb and compensate for slight camber present in the substrate 7 itself. Camber is inherent in the manufacturing process of the substrate material and should be compensated for in the filling operation to help improve the quality of via filling and to help reduce the chances of cracking the substrate material being filled. Referring now to FIGS. 6A, B and C-7 which show sequential view of the vias being filled, the lay-up is placed in a conventional press (not shown). An arbor plate 31 and a top plate 30 will be used to ensure relatively even distribution of pressure to the lay-up. As pressure is applied, with a preferable peak at 80–120 PSI (the range of operable pressures being 25–120 PSI) the psuedoplastic thixotropic rheology of the metallic paste material becomes important.

Psuedoplastic thixotropic rheology is best described as the ability of a material to undergo a dramatic change in the viscosity of the material due to shear stress as a result of compression. In this case the viscosity of the metallic paste undergoes a sufficient enough drop in viscosity to promote the easy flowing of the paste into the via holes. Generally, a column of material flows directly into the via hole. Upon release of the compressive force the viscosity of the high solids content (about 80% or more) metallic paste returns to normal. This in turn provides for more perfect filling of the vias and thus a better quality product.

One of the key issues for successful via filling is to maintain the flow properties of the metallic paste content. Implied in this statement is that volumetric solids proportion, i.e. amount of organic binder, solvent, surfactant and any other ingredient should be maintained substantially constant throughout the paste material.

Under compressive force and physical properties as discussed above the via holes are filled. As is shown particularly in FIG. 7 the metallic paste protrudes below substrate 7 and deforms newsprint 21 and tissue paper 22; this protrusion is indicated by numeral 35. Protrusion 35 is highly desirable as it creates an imprint on the newsprint paper 21 and thus inspection thereof is a strong indication that the via is completely filled. Moreover, since the metallic paste shrinks to some extent during sintering the protrusion 35 will help prevent a recess from forming due to the shrinkage.

Figure 10:
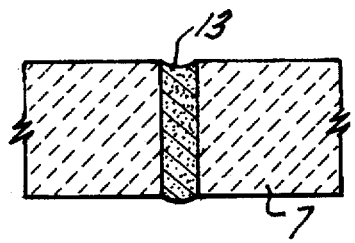
FIG. 10 is a cross section view of a via hole having paste therein and showing a recess.
Figure 9:
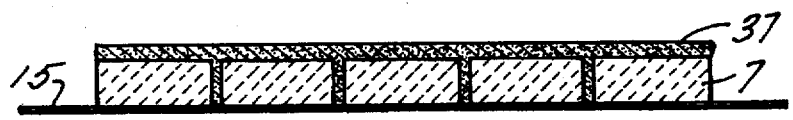
FIG. 9 is a cross sectional illustration of a substrate with via holes after filling and before scraping.

Normally, referring to FIG. 9, there is a relatively large excess of paste on the top surface of the filled via substrate. This excess paste 37 must be removed and in a way that a recess 13 as shown in FIG. 10 is not created. FIG. 10 is an illustration of the prior art showing a recess. It is exactly this type of incomplete filling which the present invention cures.

Figure 11:
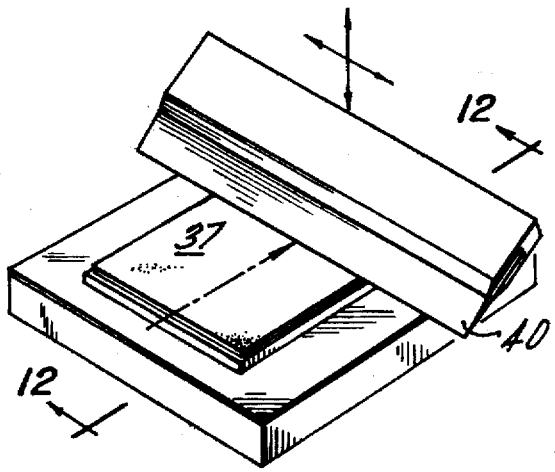
FIG. 11 illustrates, in perspective view, the preferred movement of a scraping blade.
Figure 12:
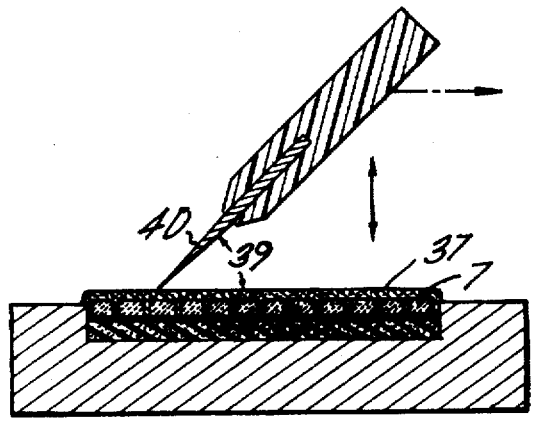
FIG. 12 is a cross section view of FIG. 11.
Figure 13:
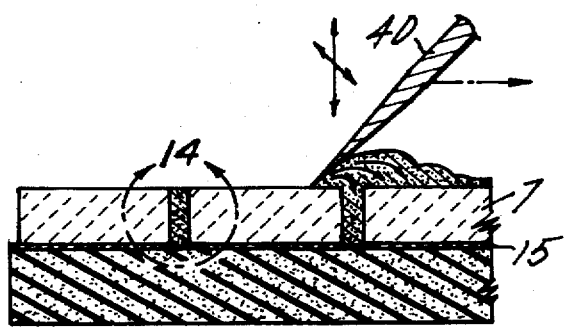
FIG. 13 is a cross section view of the action of a blade on the excess paste left on the surface of a substrate after pressing.
Figure 14:
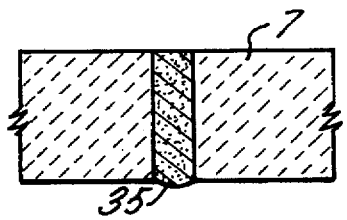
FIG. 14 is a cross sectional enlarged view of the circumscribed section of FIG. 13 showing a completely filled via.

The method of the invention, referring now to FIGS. 11–13, utilizes a blade tool 40 to scrape the excess paste 37 off the via filled substrate 7. Blade tool 40 can be of any conventional design but is preferably a tool steel blade coated with Titanium Nitride (TiN). The TiN extends the life of the blade and additionally provides lubricity to the blade surface. Blade tool 40 is most preferably moved in an oscillatory motion and vibratory motion (i.e. both vertically and horizontally). It has been determined that this motion, in conjunction with an angle of inclination of blade 40, as illustrated in FIGS. 12 and 13 most effectively removes excess paste 37 without creating any recess 13. The oscillatory motion is preferably in the range of 0.002"–0.008" in amplitude and 10 to 40 cps in frequency and the angle of inclination 39 of tool blade 40 is in the range of 10°–30°. Blade 40 is also moved side-to-side in the range of approximately 1/3 of substrate width. These ranges determine the degree of compressive force exerted on the excess paste 37 and are therefore important to the proper filling of via holes.

Utilizing the method of this invention has produced via fill results of from 99.96% to 100.00% of vias filled. These results have been demonstrated for substrates having from about 200 vias to about 2000 vias and having diameters ranging from about 0.005 inches to about 0.020 inches with substrate sizes from about 2×2 inches to about 6×6 inches and having thicknesses ranging from about 0.030 inches to about 0.060 inches. Successful filling has also been demonstrated in substrates containing a large number of loops. A particular example contained loops of about 0.009 inches to about 0.010 inches in width; this example too provided 99.96–100% filling accuracy. As a further example of the universal efficiency of the method of this invention, successful filling (99.98%) has been demonstrated in substrates 6 inches in diameter, 0.040 inches thick, having 32,000 vias 0.006–0.008 inches in diameter arranged with a pitch of 0.025", and 33,000 vias, 0.002–0.004 inches in diameter with a pitch of 0.020".

Figure 15:
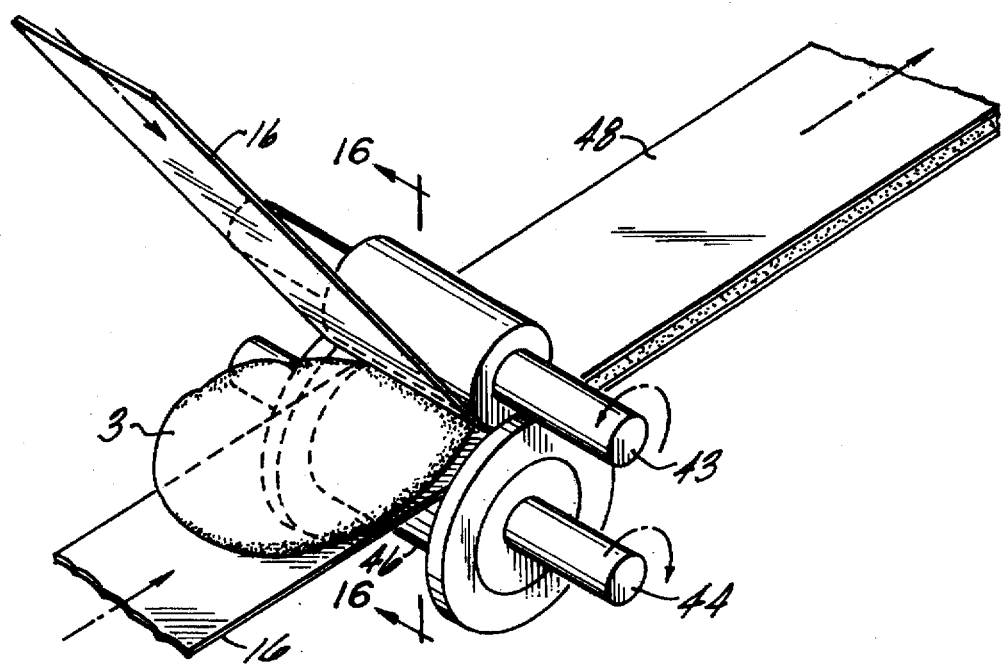
FIG. 15 is a perspective view of a metallic paste tape making arrangement.
Figure 16:
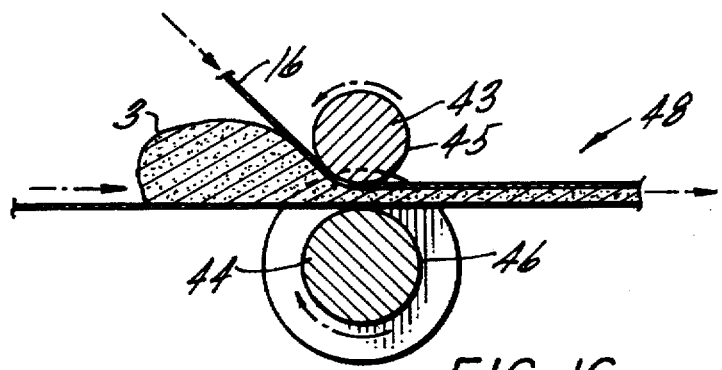
FIG. 16 is a cross section view of FIG. 15.

Referring to FIGS. 15 and 16 a preferred embodiment of the invention includes the forming of metallic paste patties by mechanized means. This embodiment creates a metallic paste tape by providing two nip rolls 43 and 44 which rotate with a fixed predetermined gap between the rolling surfaces 45 and 46 thereof. It should be noted that the rolling surfaces are coated with a resilient material 52, preferably rubber. In the mechanical method of preparing metallic paste tape 48, the nip rolls 43 and 44 are fed top and bottom lengths of release film tape 16 from remote locations (not shown). The tape 16 is fed to the nip rolls in such as manner that a converging angle of said tape is created. The converging angle allows for the reception between the two release film tape segments of a quantity of metallic paste 3. The tapes are then pulled through the nip rolls 43 and 44 either by a drive associated with the rolls themselves or by a remote drive simply pulling the tape through the rolls. As the release film tape is pulled through a predetermined gap 47 between nip rolls 43 and 44, the quantity of paste 3 is flattened between the two tapes 16 and emerges from the nip rolls in a compact sandwich of a controlled thickness.

One of the key advantages of converting the metallic paste from bulk into a sandwich of a controlled thickness by the roll compaction method as set forth above, is that the narrow profile and the non-porosity of the release film tape inhibits evaporation of volatile components in the metallic paste. This is beneficial for retention of components such as the solvent, organic binder, surfactant, etc. consequently preserving the properties of the metallic paste. Another benefit is that the method minimizes paste waste and reduces clean up time and effort.

Figure 17A:
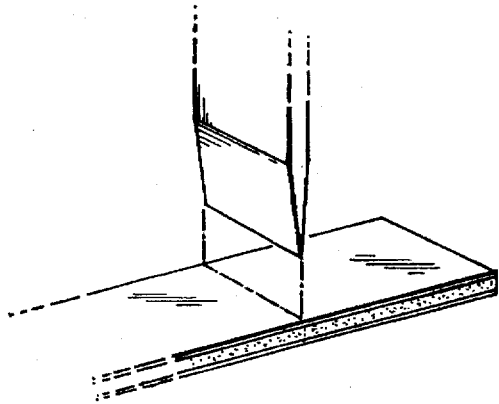
FIG. 17A is a perspective view of a paste tape cutting operation.
Figure 17B:
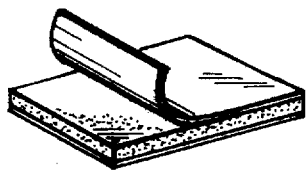
FIG. 17B is a perspective illustration of a release layer being removed from paste tape.
Figure 17C:
FIG. 17C is a metallic paste pattie of FIG. 17B with top release layer removed.
Figure 18:
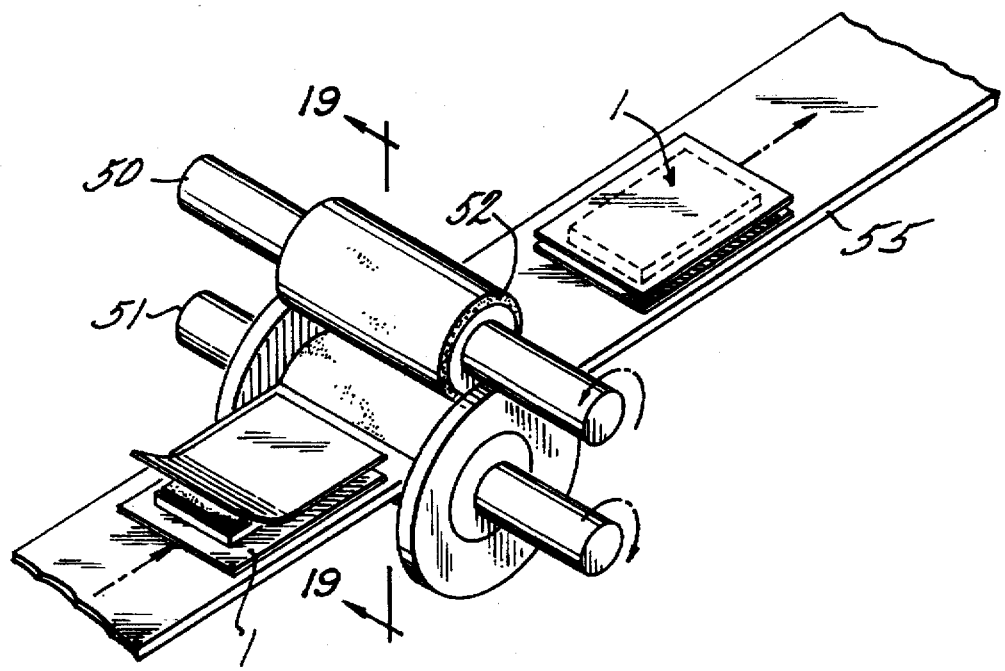
FIG. 18 is an illustration of a mechanized via filling arrangement.
Figure 19:
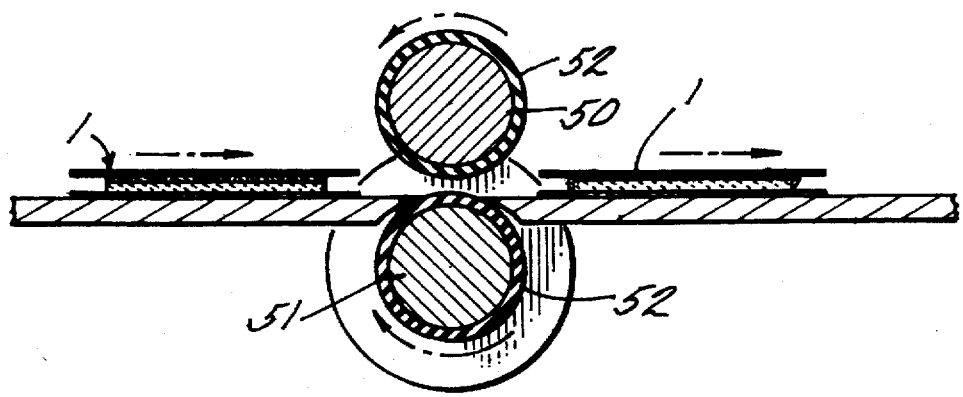
FIG. 19 is a cross section of FIG. 18.

Once the metallic paste tape 48 has been formed (consisting of release film tapes 16 and metallic paste 3) it can be taken up on a conventional reel or can be cut into various lengths for given applications or simply for convenient handling. Cutting may be accomplished in any desired conventional arrangement (see FIG. 17A).

It is also an object of this invention to mechanize the via filling operation. This is most preferably done with rubber coated nip rolls 50 and 51. The nip rolls themselves are, in fact, similar to the tape forming nip rolls 43 and 44. The rubber coating 52 thereon absorbs any camber irregularities in the substrate and paste setup to minimize flexural stress. Vias are filled as the lay-up travels between a fixed gap which is preferably only slightly wider than the substrate, release film and porous paper.

Figure 20:
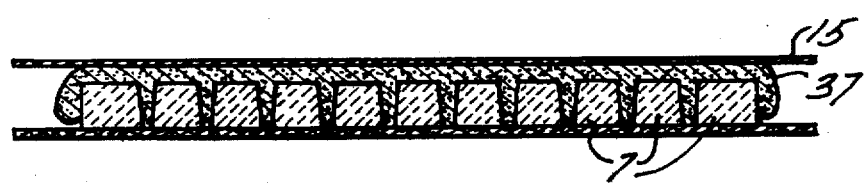
FIG. 20 is a cross section view of a substrate with inverted frustoconical vias filled, and excess paste above.
Figure 21:
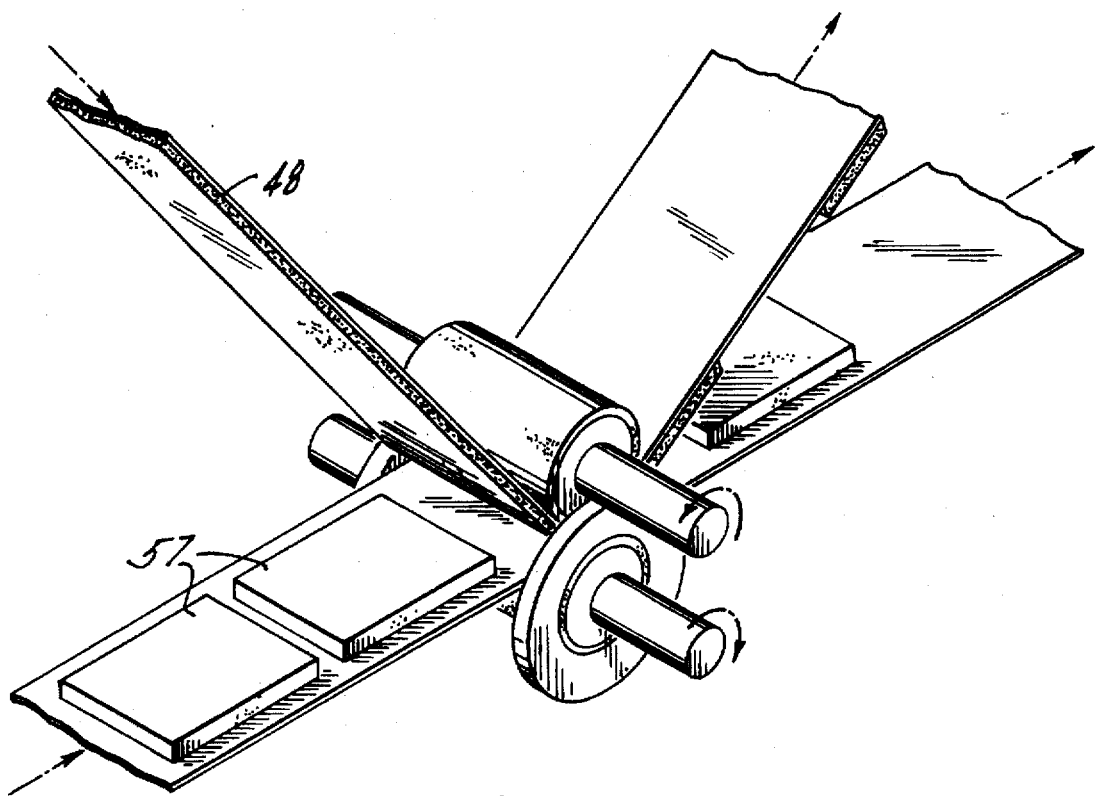
FIG. 21 is an alternate embodiment of a mechanized via filling arrangement wherein paste tape is on the upper roller and substrates are on the conveyor—convergence fills the vias.
Figure 22:
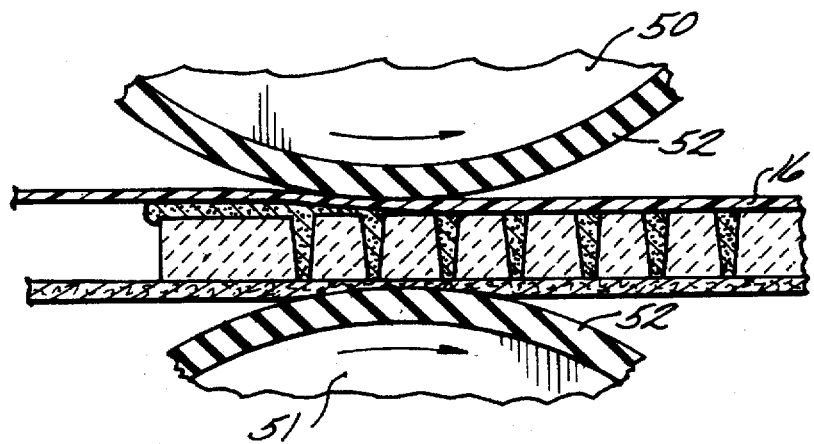
FIG. 22 is a cross section view of either roller action.

Contemplated with regard to mechanization of via filling are two preferred arrangements. The first simply places completed lay-ups 1 on a conveyor fed to a pair of nip rolls 50 and 51 where the lay-ups are compressed. Each lay-up is spaced from another a sufficient distance to prevent interference between two adjacent lay-ups on the conveyor 55. Nip rolls 50 and 51 are preferably coated with a resilient coating 52 to absorb any camber irregularities in the substrate. As individual lay-ups proceed through the nip rolls the vias are filled, see FIG. 20.

Alternatively, conveyor 55 merely transports pourous paper and substrate lay-up 57 toward the nip rolls. Paste tape 48 is supplied from a remote source (not shown) with a single side adhered to a release film tape 16, the other side of the paste being exposed. As the tape 16 and substrate 57 converge and are compressed in the rollers the vias are filled. In order to minimize wasted paste tape 48 each substrate lay-up 57 is positioned very closely to the one in from and in back, on the conveyor 55.

Excess paste is, in all cases, removed with a blade, preferably having a coating of Titanium Nitride (TiN)

Alternate embodiments for removing excess paste include a mechanized TiN coated reamer, a mechanized roller and blade combination and a manual roller and blade combination.

Figure 23:
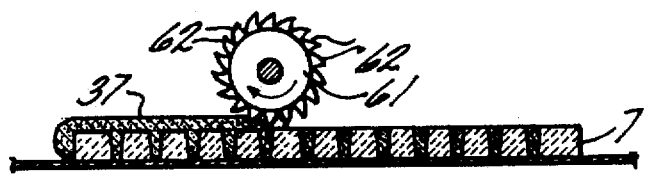
FIG. 23 is a cross section of a reamer of the invention to remove excess paste from a substrate.

The mechanized reamer is shown in FIG. 23. Generally, the reamer 61 includes teeth 62 of a saw blade type which are rotated to continuously scrape the substrate surface as the substrate 7 is transported past the reamer on a conveyor thus removing any excess paste therefrom.

Figure 24:
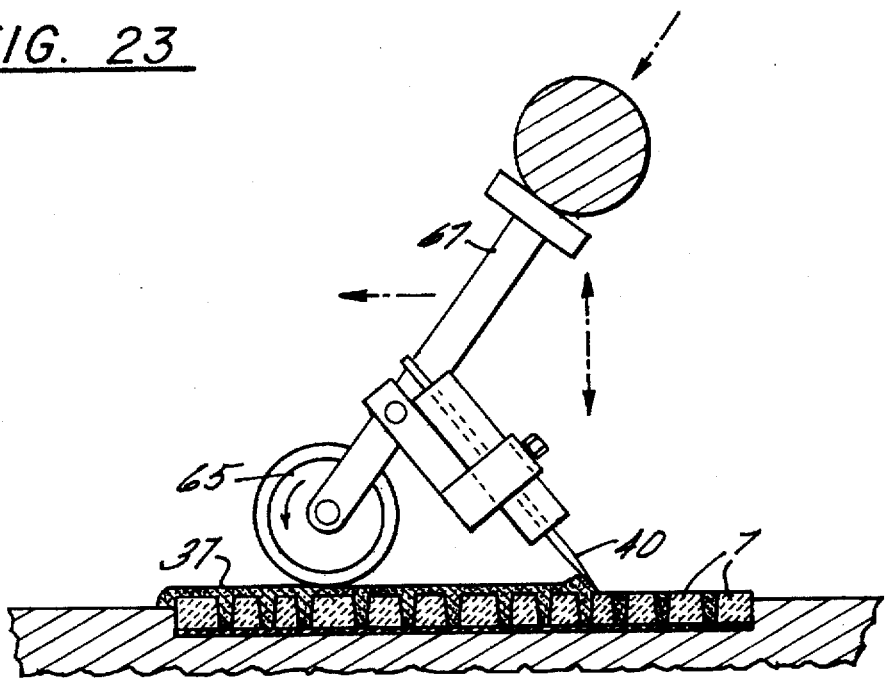
FIG. 24 illustrates an alternate scraper embodiment for removing excess paste.
Figure 25:
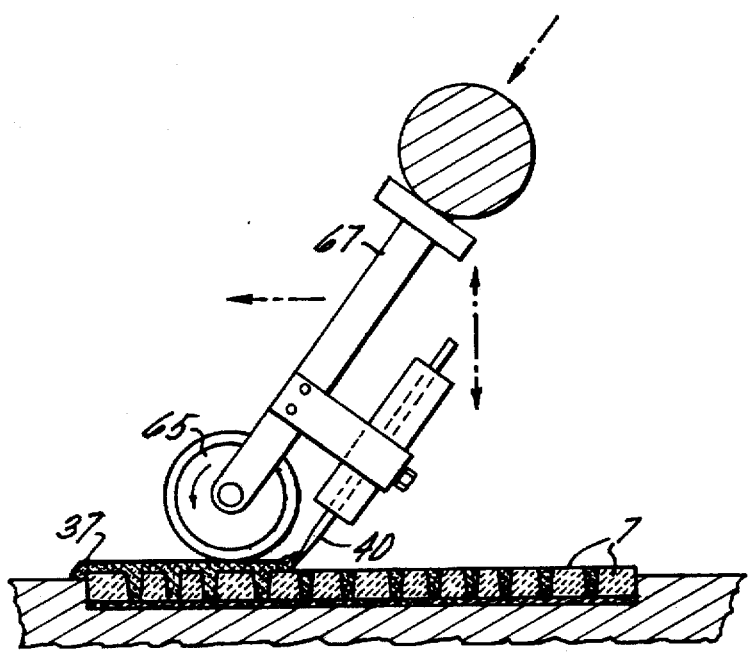
FIG. 25 illustrates another alternate scraper embodiment for removing excess paste.

The mechanized and manual roller and blade combinations are similar, as is illustrated in FIGS. 24 and 25; both use a leading roller 65 design and can be outfitted with a forwardly or rearwardly leaning TiN coated blade 40 on a hand-held or mechanized frame 67. Moreover, it has been determined that a vibratory and oscillatory movement (i.e., up and down and back and forth) of the blade is desirable to further compact the paste in the via holes and ensure that the paste is level with the surface of the vias.

It is important to note the methods of the present invention are useable for both columnar vias and inverted frustoconical vias. The methods are equally effective for both.

While preferred embodiments have been shown and described, various modifications and substitutions may be made thereto without departing from the spirit and scope of the invention. Accordingly, it is to be understood that the present invention has been described by way of illustration and not limitation.

What is claimed is:

1. A method of filling at least one via hole in a substrate with a metallic paste comprising the steps of:
   a) building a lay-up of:
      1) a porous material, and
      2) a substrate having at least one via hole;
   b) placing said lay-up in a conveyor leading through a pair of nip rolls having a fixed gap therebetween;
   c) providing a tape comprising a release film adhered to a continuous length of uniformly sized metallic paste, said metallic paste being positioned adjacent said substrate;
   d) compressively joining said tape and said lay-up as they pass through the nip rolls, whereby the metallic paste is transferred to the substrate and into the at least one via hole.

2. A method of filling via holes in a substrate with a metallic paste as claimed in claim 1 wherein the nip rolls are coated with a deformable resilient coating.

* * * * *